_(12)_ United States Patent
Wang et al.

(10) Patent No.: US 9,108,840 B2
(45) Date of Patent: Aug. 18, 2015

(54) MEMS MICROPHONE AND METHOD FOR PACKAGING THE SAME

(75) Inventors: Zhe Wang, Singapore (SG); Qinglin Song, WeiFang (CN); Shengli Pang, WeiFang (CN); Fanghui Gu, WeiFang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 13/581,823

(22) PCT Filed: Dec. 30, 2010

(86) PCT No.: PCT/CN2010/080486
§ 371 (c)(1),
(2), (4) Date: Aug. 30, 2012

(87) PCT Pub. No.: WO2012/088688
PCT Pub. Date: Jul. 5, 2012

(65) Prior Publication Data
US 2014/0008740 A1 Jan. 9, 2014

(51) Int. Cl.
*B81B 3/00* (2006.01)
*H04R 19/00* (2006.01)
*H04R 31/00* (2006.01)
*B81C 1/00* (2006.01)
*H04R 1/02* (2006.01)

(52) U.S. Cl.
CPC .......... *B81B 3/0018* (2013.01); *B81C 1/00158* (2013.01); *B81C 1/00246* (2013.01); *H04R 19/005* (2013.01); *H04R 31/00* (2013.01); *B81B 2201/0257* (2013.01); *B81B 2207/015* (2013.01); *H04R 1/021* (2013.01); *H04R 2201/003* (2013.01)

(58) Field of Classification Search
CPC .................... B81B 3/0018; B81B 2201/0257;
H04R 31/00; H04R 7/00; H04R 2201/02;
H04R 2203/00; H04R 19/04; H04R 1/00;
H04R 3/00; H04R 19/016
USPC ........ 257/3, 414, 416, 667, 676, 686, E23.14, 257/E29.12; 381/174, 175, 355, 361
See application file for complete search history.

(56) References Cited

U.S. PATENT DOCUMENTS 6,522,762 B1 * 2/2003 Mullenborn et al. ......... 381/174
7,885,423 B2 * 2/2011 Weigold ...................... 381/174
(Continued)

OTHER PUBLICATIONS

Office Action to related Chinese Application No. 201080062318.2 dated Sep. 30, 2013.

*Primary Examiner* — Marcos D. Pizarro
*Assistant Examiner* — Sue Tang
(74) *Attorney, Agent, or Firm* — Troutman Sanders LLP (57) ABSTRACT

The present invention relates to a MEMS microphone and a method of manufacturing the same, the MEMS microphone comprising: a monolithic silicon chip incorporating an acoustic sensing element and one or more conditioning CMOS integrated circuits; a silicon-based carrier chip having an acoustic cavity; a substrate for surface mounting the assembly of the monolithic chip and the silicon-based carrier chip thereon; a conductive cover attached and electrically connected to the substrate to accommodates the assembly of the monolithic chip and the silicon-based carrier chip; and an acoustic port formed on either the conductive cover or the substrate for an external acoustic wave to reach the acoustic sensing element, wherein the monolithic silicon chip, the silicon-based carrier chip and the acoustic port are configured in such a way that the diaphragm of the acoustic sensing element can be vibrated by the external sound wave from one side thereof.

15 Claims, 5 Drawing Sheets

(56) References Cited

U.S. PATENT DOCUMENTS

| | | | |
|---|---|---|---|
| 8,433,084 B2 * | 4/2013 | Conti et al. | 381/174 |
| 2006/0177173 A1 * | 8/2006 | Shastri et al. | 385/14 |
| 2007/0057602 A1 * | 3/2007 | Song | 310/328 |
| 2009/0101998 A1 * | 4/2009 | Yen et al. | 257/416 |
| 2011/0158453 A1 * | 6/2011 | Tanaka et al. | 381/361 |

* cited by examiner

Fig. 1

Step S201    Fig. 2A

Step S203    Fig. 2B

Step S205

Fig. 2C

Step S207

Fig. 2D

Step S209

MEMS MICROPHONE AND METHOD FOR PACKAGING THE SAME

This application is a US National Stage of International Application No. PCT/CN2010/080486 filed 30 Dec. 2010.

FIELD OF THE INVENTION

The present invention relates to the field of microphone technology, and more specifically, to a MEMS microphone and a method for packaging the same.

BACKGROUND

The silicon based MEMS microphones, also known as acoustic transducers, are playing a more and more important role in the hearing instrument, mobile communication system, digital camera, video camera and toy industry. One of the major issues is to miniaturize the MEMS microphone while still maintaining performances such as sensitivity, noise, compactness, robustness electromagnetic interference (EMI) shielding very well. There have been several attempts made in this respect.

U.S. Pat. No. 6,324,907 discloses a flexible substrate transducer assembly comprising a flexible elongate member, a transducer system, and a lid, wherein the transducer system mounted on the flexible elongate member and covered by the lid includes at least two dies for sensing physical signals and processing electrical signals respectively. The lid and the flexible printed circuit substrate provide good EMI shielding, however, the footprint size of the transducer assembly is large due to an elongate substrate, and the separation of the sensing element and the conditioning integrated circuits requires large package housing.

U.S. Pat. No. 6,781,231 discloses a MEMS package comprising a MEMS microphone including a MEMS acoustic sensing element and conditioning integrated circuits, a substrate for supporting the MEMS microphone and a conductive lid for covering the MEMS microphone. The conductive lid and the substrate can form a housing to accommodate the MEMS microphone and shield the same from electromagnetic interference, however, there are two limiting factors hindering the size reduction of the package herein, i.e. (1) the MEMS acoustic sensing element is separated from the conditioning integrated circuits, and (2) wiring between the integrated circuit element and the substrate takes spaces.

European patent EP 1214864 discloses a sensor system comprising a carrier member, a transducer element, and an electronic device, wherein the transducer element and the electronic device are both bonded onto the carrier member and are electrically interconnected via contact elements held on the carrier member. However, there is no good shielding for the sensor system, and there is no stress buffering between the silicon device and the application printed circuit board (PCB) board.

Therefore, there is a need for a MEMS microphone with a minimized size as well as a good performance, and a method for packaging the MEMS microphone.

SUMMARY

In view of the above, the present invention provides a MEMS microphone and a method for packaging the same. With the MEMS microphone according to the present invention, a monolithic chip incorporating an acoustic sensing element and one or more conditioning CMOS integrated circuits is bonded with a silicon carrier chip having an acoustic cavity using wafer-level packaging technology which has flip-chip bonding pads, and the acoustic sensing element includes a compliant diaphragm, a perforated backplate having through holes, and an air gap between the compliant diaphragm and the backplate. In this way, the MEMS microphone can have a miniaturized size with good performance.

According to an aspect of the present invention, there is provided a MEMS microphone, comprising: a monolithic silicon chip incorporating an acoustic sensing element and one or more conditioning CMOS integrated circuits, wherein the acoustic sensing element includes a compliant diaphragm, a perforated backplate having through holes, and an air gap between the compliant diaphragm and the backplate; a silicon-based carrier chip having an acoustic cavity, metal through-silicon-via lead-outs and metal pad on both sides of each of the metal through-silicon via lead-outs, wherein the silicon-based carrier chip is seal bonded and electrically connected with the monolithic silicon chip on the backplate side of the monolithic silicon chip; a substrate for flip-chip mounting the assembly of the monolithic chip and the silicon-based carrier chip thereon; a conductive cover having a center cavity bounded with its edges attached and electrically connected to the substrate, the center cavity accommodates the assembly of the monolithic chip and the silicon-based carrier chip; and an acoustic port formed on either the conductive cover or the substrate for an external acoustic wave to reach the acoustic sensing element, wherein the monolithic silicon chip, the silicon-based carrier chip and the acoustic port are configured to cause the external acoustic wave to vibrate the compliant diaphragm of the acoustic sensing element from one side thereof.

In one or more embodiments, the silicon-based carrier chip may be formed with metal through-silicon via lead-outs and metal pads, the metal pads being on both side of each of the metal through-silicon via lead-outs, wherein the metal pads on one side of the silicon-based carrier chip are bonded to the monolithic silicon chips, and the metal pads on other side are bonded onto the substrate, and the substrate is formed with electrical lead-outs and pads.

In one example, the acoustic port may be formed on either side of the conductive cover, and no open hole may be formed on the bottom of the acoustic cavity. In another example, the acoustic port may be formed on either side of the conductive cover, one or more open holes may be formed on the bottom of the acoustic cavity, and the silicon-based carrier chip may be seal boned with the substrate.

In another example, the acoustic port may be formed on the substrate, the acoustic cavity of the silicon-based carrier chip may have one or more open holes on its bottom, and the silicon-based carrier chip may be seal bonded and electrically connected with the substrate.

Further, in still another example, preferably, the acoustic port may be aligned with at least one of the open holes on the bottom of the cavity in the silicon-based carrier chip. In an alternative example, the acoustic cavity of the silicon-based carrier chip may be aligned to the backplate of the monolithic silicon chip.

Further, in yet still another example, the bonding between the monolithic silicon chip and the silicon-based carrier chip may be metal eutectic bonding at low temperature below 400° C.

Further, in another example, the conductive cover may be either soldered onto the substrate or attached to the substrate by using conductive adhesives. In an alternative, preferably, the bonding between the silicon based carried chip and the substrate may be flip-chip bonding using solder.

Further, the substrate may be any printed circuit board with single or multiple FR4 layers, and the substrate is formed with electrical lead-outs and pads on both sides.

Further, in still another example, the conductive cover is made of either metal or plastic with metal coated or plated.

According to another aspect of the present invention, there is provided a method for manufacturing a MEMES microphone, comprising: preparing a monolithic silicon chip integrating an acoustic sensing element and one or more conditioning CMOS integrated circuits, wherein the acoustic sensing element includes a compliant diaphragm, a perforated backplate having through holes, and an air gap between the compliant diaphragm and the backplate; preparing a silicon-based carrier chip having an acoustic cavity, metalized through-silicon via lead-outs, and metal pads on both side of each of the metalized through-silicon via lead-outs; bonding the silicon-based carrier chip with the monolithic chip on the backplate side of the acoustic sensing element using metal eutectic bonding; flip-chip bonding the assembly of the monolithic chip and the silicon-based carrier chip onto a substrate; attaching a conductive cover having a center cavity bounded with its edges onto the substrate on its edges, the center cavity accommodates the assembly of the monolithic silicon chip and the silicon-based carrier chip, wherein an acoustic port is formed on either the conductive cover or the substrate for an external acoustic wave to reach the acoustic sensing element.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diaphragm form in order to facilitate describing one or more aspects.

Various embodiments of the present invention will be descried with reference to the accompanying drawings.

The First Embodiment

Figure 1:
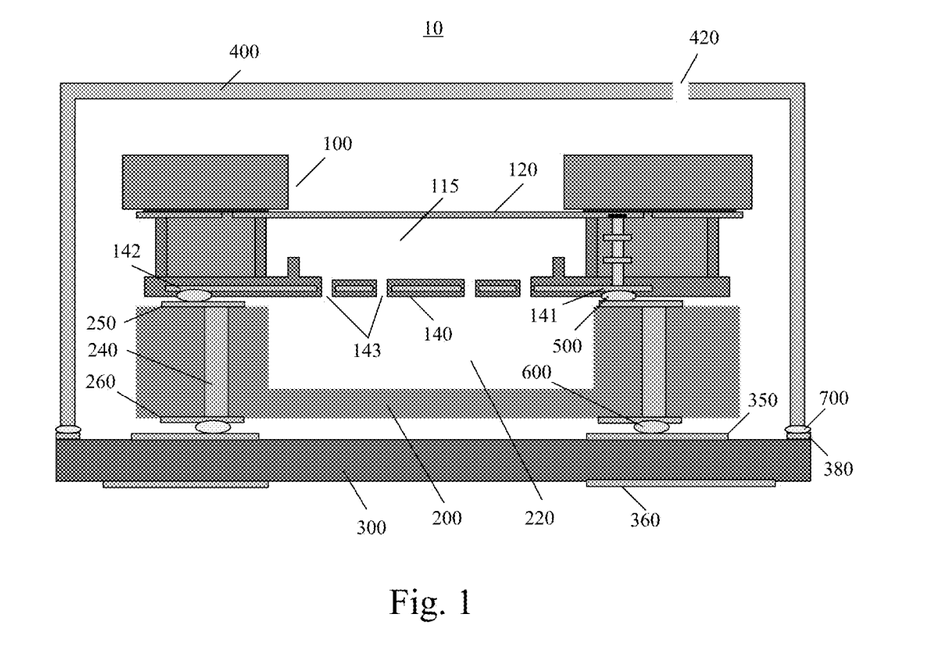
FIG. 1 is a cross-sectional view showing the structure of the MEMS microphone according to the first embodiment of the present invention.

FIG. 1 is a cross-sectional view showing the example structure of the MEMS microphone 10 according to the first embodiment of the present invention.

As shown in FIG. 1, the MEMS microphone 10 may include a monolithic silicon chip incorporating an acoustic sensing element 100 and conditioning CMOS integrated circuits (not shown), a silicon-based carrier chip 200, a substrate 300, and a conductive cover 400 with an acoustic port 420 formed thereon.

The monolithic silicon chip according to the present embodiment may include an acoustic sensing element 100 and conditioning CMOS integrated circuits (not shown). The monolithic silicon chip may receive an acoustic signal and transform the received acoustic signal into an electrical signal by the acoustic sensing element 100, and process and output the electrical signal by the conditioning CMOS integrated circuits. As shown in FIG. 1, the acoustic sensing element 100 may include a compliant diaphragm 120 such as a vibrating diaphragm, a perforated backplate 140 with a plurality of through holes 143 formed in the portions thereof opposite to the diaphragm 120, and an air gap 115 between the diaphragm 120 and the backplate 140 for separating the diaphragm 120 from the microphone backplate 140. The diaphragm 120 in this embodiment serves as a vibration membrane which vibrates in response to an external acoustic wave reaching the diaphragm 120 from the outer side thereof, as well as an electrode. The backplate 140 provides another electrode of the acoustic sensing element 100, and has a plurality of through holes 143 formed thereon, which are used for air ventilation so as to reduce air damping that the diaphragm 120 will encounter when starts vibrating. An example of the acoustic sensing element 100 as above is described in details in the international application No. PCT/CN2010/075514, the contents of which are incorporated herein by reference. Further, the conditioning CMOS integrated circuits and their integration with the acoustic sensing element 100 are known in the art, and will omit the detailed description thereof.

The monolithic silicon chip may also have an electrode pad 141 extracted from signal output of conditioning IC, and an electrode pad 142 extracted from the power supply to the conditioning IC spread on the same side, for example, on the backplate 140 side of the monolithic silicon chip.

The silicon-based carrier chip 200 may be provided with a cavity 220 formed in the center thereof and a plurality of via holes formed around the cavity 220, wherein the cavity 220 is extended from the upper surface to a certain depth of the silicon-based carrier chip 200 and is opposite to the backplate 140 of the acoustic sensing element 100 of the monolithic silicon chip. The plurality of via holes are extended from the upper surface to the lower surface of the silicon-based carrier chip 200 and filled with metal 240 therein. Each of the metal lead-outs 240 filled in the plurality of through-holes is electrically connected at its two ends with two metal pads which are spread on the upper surface and lower surface of the silicon-based carrier chip 200, respectively. The electrode pads (i.e. the pad 141, the pad 142 and/or other pads) on the backplate 140 side of the monolithic silicon chip are bonded onto the corresponding metal pads 250 on the upper surface of the silicon-based carrier chip by using for example metal eutectic bonding (e.g. SnAu, etc), so that the monolithic silicon chip is bonded onto and electrically connected with the silicon-based carrier chip 200. Note that the metal eutectic bonding bumps 500 forms a part of a sealing ring around the cavity 220, which means that the external acoustic wave cannot passes through the sealing ring.

The substrate 300 may be made of for example a double-layer PCB board. In this example, the substrate 300 is provided with PCB routing layers 350, 360 on both sides thereof. The substrate 300 is also formed with electrical lead-outs and pads on both sides. The metal pads 260 on the lower surface of the silicon-based carrier chip 200 are flip-chip bonded onto the predetermined portions of PCB routing layer 350 on the upper surface of the substrate 300 for example by soldering or by using conducting adhesives 600 so that the silicon-based carrier chip 200 bonded with the monolithic silicon chip is mounted onto and electrically connected with the substrate 300. The substrate 300 is further provided with a metal ring pad 380 on the upper surface and along the periphery of the substrate 300, which is used for attaching and electrically connecting the substrate 300 with the conductive cover 400 as described later. The above is only an example of the substrate 300. In the alternative, the substrate 300 may be made of multilayered PCB board or a flexible printed circuit (FPC) board.

The conductive cover 400 may be made of a metal or a plastic coated with a conductive layer on either inner or outer surface thereof, and provided with a center cavity with its edges attached and electrically connected to the metal ring pad 380 of the substrate 300 for example by soldering or by using conducting adhesives 700. Thus, the conductive cover 400 and the substrate 300 form an enclosure space to accommodate the monolithic silicon chip and the silicon based carrier chip 200, and can shield the same from external electromagnetic interference. The conductive cover 400 may be further provided with an acoustic port 420 thereon, preferably on the top surface of the cover, for the external acoustic wave to reach the acoustic sensing element 100 of the monolithic silicon chip accommodated therein. Apparently, the acoustic port 420 may be formed on other surface of the cover.

As described above, in the MEMS microphone 10 according to the first embodiment of the invention, the conductive cover 400 and the substrate 300 form a chamber to accommodate the monolithic silicon chip and the silicon-based carrier chip 200, which communicates with the outside through the acoustic port 420 on the conductive cover 400, while the air gap 115 of the monolithic silicon chip and the cavity 220 of the silicon-based carrier chip 200 communicate with each other through the through holes 143 on the backplate 140 of the acoustic sensing element 100 and form an inner space, which is acoustically sealed from the chamber communicating with the outside. Therefore, the external acoustic wave can enter the chamber through the acoustic port 420 on the conductive cover 400, and reach and vibrate the diaphragm 120, only from the outside thereof (i.e., from the top side of the diaphragm 120 from the view of FIG. 1), of the acoustic sensing element 100 of the monolithic silicon chip, which can ensure any external acoustic wave not to reach the diaphragm 120 from another side thereof to counter-force the vibration of the diaphragm 120.

The cavity 220 of the silicon-based carrier chip 200 affords more back chamber space so as to reduce air resistance, caused by the pressurized air in the inner space, that the diaphragm 120 will encounter when starts vibrating. Furthermore, the silicon-based carrier chip 200 may also serve as a stress buffer between the monolithic silicon chip and the substrate 300.

In another variation of the present embodiment, the bottom of the cavity 220 of the silicon-based carrier chip 200 may be provided with through-holes while the assembly of the monolithic silicon chip and the silicon based carrier chip being seal bonded to the PCB substrate, the advantage of which is that the same assembly of the monolithic silicon chip and the silicon based carrier as described in this variation can be applied in both the present embodiment and the second embodiment as described later.

In still another variation of the present embodiment, the bonding material may use an electrically anisotropic conductive polymer or anisotropic conductive film (ACF) instead, which is characterized in that it may only conduct a current in one direction and may not conduct a current in other two directions perpendicular to the said one direction. The advantage of using such a material as the bonding material is that the bonding material can form a sealing ring by itself without causing short circuit.

Hereinafter, a method of manufacturing the MEMS microphone 10 according to the first embodiment of the present invention will be described with reference to FIG. 2A through FIG. 2F. FIG. 2A through FIG. 2F are cross-sectional views showing a method of manufacturing the MEMS microphone 10 according to the first embodiment of the present invention. In the following description, for sake of clarity and conciseness, a lot of processing details, such as equipments, conditions, parameters and so on, are omitted in considering that they are well known by those skilled in the art.

Figure 2A:
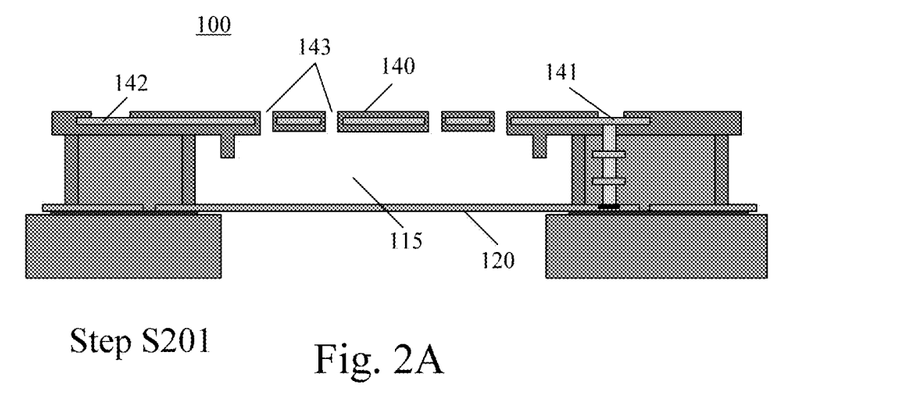
FIG. 2A through FIG. 2E are cross-sectional views showing a method of manufacturing the MEMS microphone according to the first embodiment of the present invention.

In Step S201, as shown in FIG. 2A, prepare a monolithic silicon chip incorporating an acoustic sensing element 100 and conditioning CMOS integrated circuits as described above, wherein the acoustic sensing element 100 of the monolithic silicon chip includes a compliant diaphragm 120, a backplate 140 with a plurality of through holes 143 formed in the portions thereof opposite to the diaphragm 120, an air gap 115 between the diaphragm 120 and the backplate 140 for separating the diaphragm 120 from the backplate 140, and a plurality of electrode pads spread on the backplate 140 side of the monolithic silicon chip, which include an electrode pad 141 which may be extracted from the power supply or the diaphragm 120, an electrode pad 142 extracted from the signal output or the backplate 140 and other electrode pads (not shown) extracted from the conditioning CMOS integrated circuits. The method of manufacturing the monolithic silicon chip is described in details for example in the international application No. PCT/CN2010/075514, and will not be repeated herein.

Figure 2B:
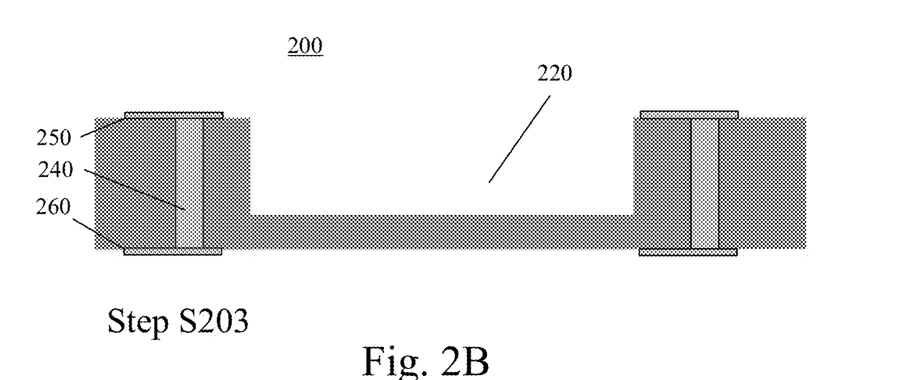

In Step S203, as shown in FIG. 2B, prepare a silicon-based carrier chip 200 as described above. The silicon-based carrier chip 200 may be formed by preparing a silicon based substrate first, then for example, patterning and etching the silicon based substrate by Si Deep Reactive Ion Etching (DRIE) or Wet Etching to a certain depth to form a cavity 220 therein, patterning and etching the silicon based substrate in a similar way around the cavity 220 to form a plurality of through holes, filling the through holes with metal by plating to form the electrical lead-outs 240 and evaporating metal on both surfaces of the silicon based substrate to form the metal pads 250, 260 on both sides of the electrical lead-outs 240. Note that the method of manufacturing the silicon-based carrier chip 200 is known in the art and can be modified in other ways without departing from the scope and spirit of the invention.

Figure 2C:
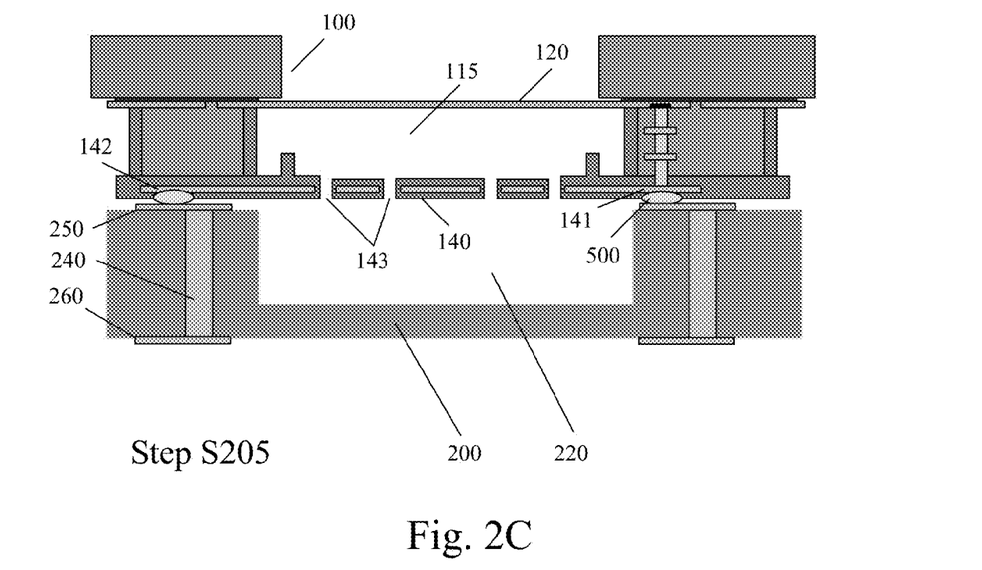

In Step S205, as shown in FIG. 2C, seal bonding the silicon-based carrier chip with the monolithic chip on the backplate 140 side of the acoustic sensing element 100 using metal eutectic bonding (e.g. SnAu, etc), so as to make the air gap and the acoustic cavity to communicate with each other. For example, turn the monolithic silicon chip prepared in Step S201 upside down so that the backplate 140 of the acoustic sensing element 100 of the monolithic silicon chip faces the cavity 220 of the silicon-based chip 200 and the electrode pads (for example, electrode pads 141, 142, etc.) formed on the backplate 140 side of the monolithic silicon chip face the corresponding metal pads 250 formed on the upper surface of the silicon-based carrier chip 200. Subsequently, bond the electrode pads of the monolithic silicon chip onto the corresponding metal pads 250 of the silicon-based carrier chip 200 by using for example metal eutectic bonding 500 at low temperature below 400° C. so as to bond the monolithic silicon chip onto the silicon-based carrier chip 200.

Figure 2D:
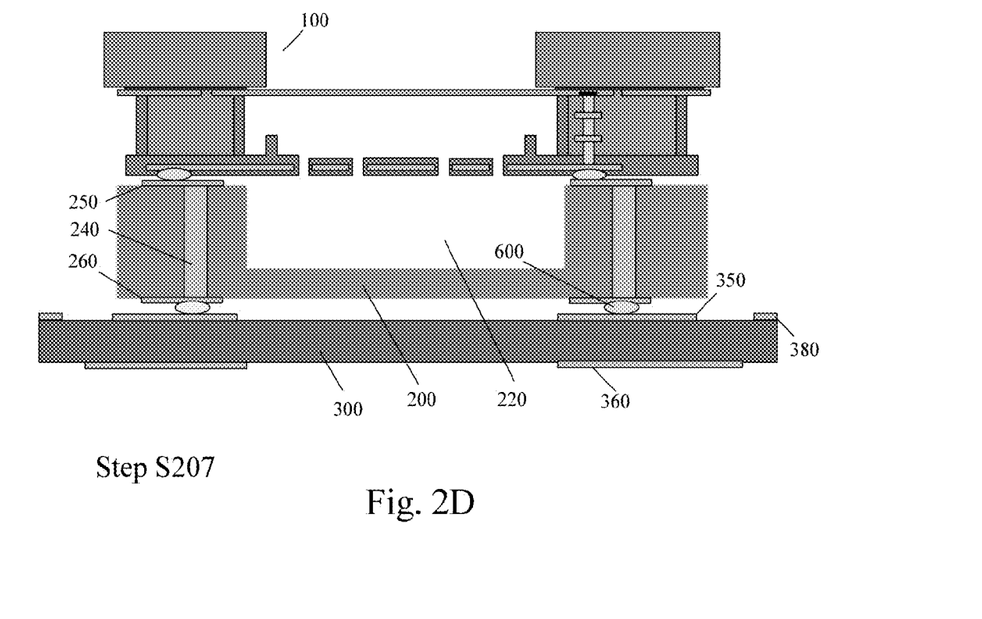

In Step S207, as shown in FIG. 2D, flip chip bonding the assembly of the monolithic chip and the silicon-based carrier chip 200 onto the substrate 300. For example, bond the metal pads 260 on the lower surface of the silicon-based carrier chip 200 onto the predetermined portions of the PCB routing layer 350 on the upper surface of the substrate 300 by using for example conducting adhesives or solder 600, so that the silicon-based carrier chip 200 bonded with the monolithic silicon chip is mounted onto and electrically connected with the substrate 300.

Figure 2E:
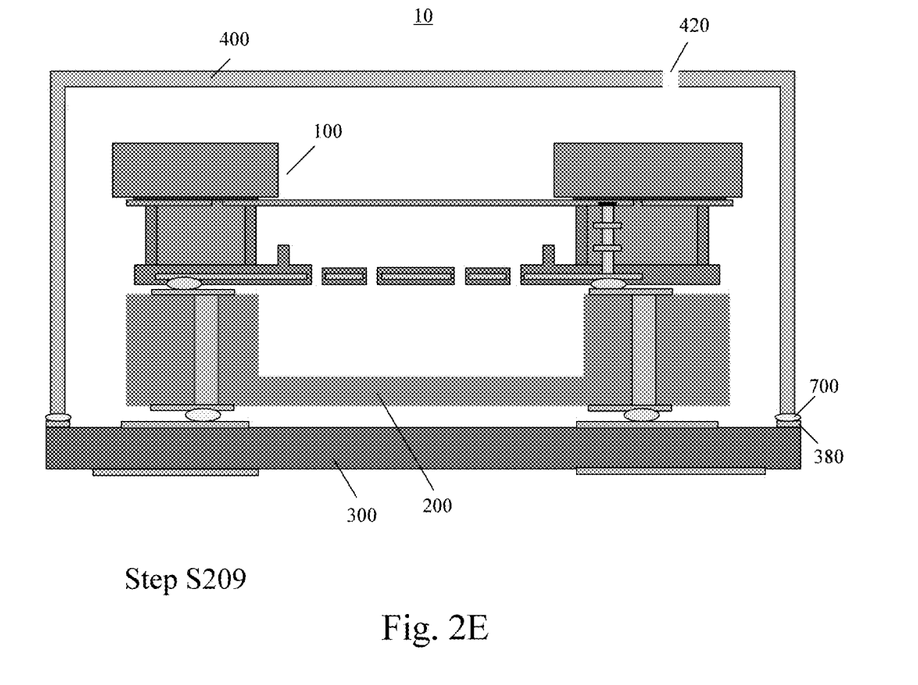

In Step S209, as shown in FIG. 2E, attaching a conductive cover having a center cavity bounded with its edges onto the substrate on its edges, the center cavity accommodates the assembly of the monolithic silicon chip and the silicon-based carrier chip. For example, attach and electrically connect the edges of the open side of the conductive cover 400 to the metal ring pad 380 on the upper surface of the substrate 300 by soldering or by using for example conducting adhesives 700. Thus, the conductive cover 400 and the substrate 300 form an enclosure to accommodate the monolithic silicon chip and the silicon based carrier chip 200, and the acoustic port 420 on the conductive cover 400 allows the external acoustic wave to enter the enclosure and reach the acoustic sensing element 100 from the one side thereof (i.e., from the top side of the diaphragm 120 from the view of FIG. 1).

Hitherto, there is provided a method of manufacturing the MEMS microphone according to the first embodiment of the present invention. However, in the above method, Step S201-S203 can be processed in a different sequence.

The Second Embodiment

Figure 3:
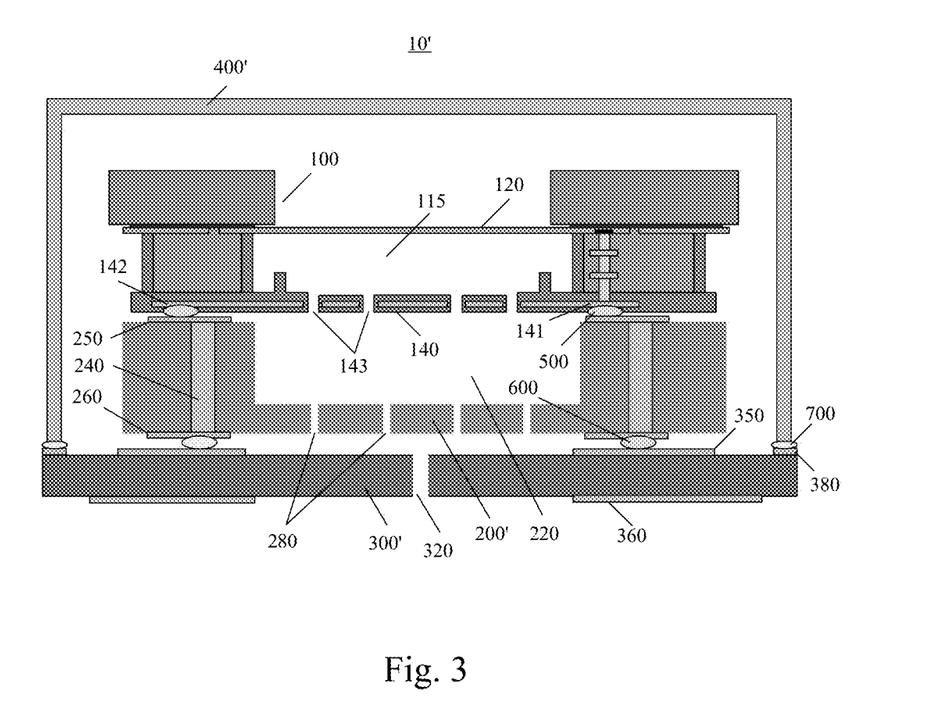
FIG. 3 is a cross-sectional view showing the structure of the MEMS microphone according to the second embodiment of the present invention.

Now, an example structure of the MEMS microphone according to the second embodiment of the present invention will be described with reference to FIG. 3. FIG. 3 is a cross-sectional view showing the example structure of the MEMS microphone 10' according to the second embodiment of the present invention. Compared with FIG. 1, FIG. 3 is distinguished from FIG. 1 in that, in the second embodiment, the acoustic port 320 is formed on the PCB substrate 300'; a plurality of through-holes 280 are formed on the bottom of the cavity 220 of the silicon-based carrier chip 200'; and the silicon-based carrier chip is seal bonded and electrically connected with the substrate. For example, the soldering agents or the conductive adhesives 600 form an sealing ring between the silicon-based carrier chip 200' and the PCB substrate 300', which means that the external acoustic wave cannot passes through the sealing ring and reach the diaphragm 120 from top side thereof (from the view of FIG. 3), preventing the external wave from vibrating the diaphragm 120 from the top side thereof, and thus the external acoustic wave only vibrates the diaphragm 120 from the bottom side thereof (from the view of FIG. 3).

As described above, in the MEMS microphone 10 according to the first embodiment, the chamber formed by the cover 400 and the PCB substrate 300 communicates with the outside environment through the port 420 formed on the cover 400, and is divided, by the diaphragm 120, into two volumes wherein, according to the sound entrance path, the one between the diaphragm 120 and the sound port 420 is front channel and another one between the diaphragm 120 and the cavity 220 serves as back chamber (from the view of FIG. 1). In contrast, in the MEMS microphone 10' according to the second embodiment, the chamber formed by the cover 400 and the PCB substrate 300 communicates with the outside environment through the port 420 formed on the substrate 300, and is divided, by the diaphragm 120, into two spaces wherein, according to the sound entrance path, the one between the diaphragm 120 and the sound port 420 is front channel and another one between the diaphragm 120 and the cover 400 serves as back chamber (from the view of FIG. 3).

The method of manufacturing the MEMS microphone according to the second embodiment of the present invention is similar to that of the first embodiment. Thus, the detailed description thereof is omitted.

It should be noted that a circular shape for the MEMS microphone is normally preferred, but other shapes like square, rectangular or other polygonal shapes are possible.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A MEMS microphone, comprising:
a monolithic silicon chip incorporating an acoustic sensing element and one or more conditioning CMOS integrated circuits, wherein the acoustic sensing element includes a compliant diaphragm, a perforated backplate having through holes, and an air gap between the compliant diaphragm and the backplate, wherein the air gap is located within the monolithic silicon chip;
a silicon-based carrier chip having an acoustic cavity, metal through-silicon-via lead-outs and metal pad on both sides of each of the metal through-silicon via lead-outs, wherein the silicon-based carrier chip is seal bonded and electrically connected with the monolithic silicon chip on the backplate side of the monolithic silicon chip;
a substrate for flip-chip mounting the assembly of the monolithic chip and the silicon-based carrier chip thereon;
a conductive cover having a center cavity bounded with its edges attached and electrically connected to the substrate, the center cavity accommodates the assembly of the monolithic chip and the silicon-based carrier chip; and
an acoustic port formed on either the conductive cover or the substrate for an external acoustic wave to reach the acoustic sensing element,
wherein the monolithic silicon chip, the silicon-based carrier chip and the acoustic port are configured to cause the external acoustic wave to vibrate the compliant diaphragm of the acoustic sensing element from one side thereof,
wherein the monolithic silicon chip comprises a plurality of electrode pads on the backplate side of the monolithic silicon chip, the plurality of electrode pads comprise an electrode pad extracted from signal output of the conditioning CMOS integrated circuit and an electrode pad extracted from the power supply to the conditioning CMOS integrated circuit on the same side, wherein the MEMS microphone also comprises a metal eutectic bonding bonded between the metal pads and the electrode pads so as to bond the silicon-based carrier chip and the monolithic silicon chip.

2. The MEMS microphone of claim 1, wherein the silicon-based carrier chip is formed with metal through-silicon via lead-outs and metal pads, the metal pads being on both side of each of the metal through-silicon via lead-outs, wherein the metal pads on one side of the silicon-based carrier chip are bonded to the monolithic silicon chips, and the metal pads on other side are bonded onto the substrate.

3. The MEMS microphone of claim 1, wherein the acoustic port is formed on either side of the conductive cover, one or more open holes are formed on the bottom of the acoustic cavity, and the silicon-based carrier chip is seal boned with the substrate.

4. The MEMS microphone of claim 1, wherein the acoustic port is formed on the substrate, the acoustic cavity of the silicon-based carrier chip has one or more open holes on its bottom, and the silicon-based carrier chip is seal bonded and electrically connected with the substrate.

5. The MEMS microphone of claim 4, wherein the acoustic port is aligned with at least one of the open holes on the bottom of the cavity in the silicon-based carrier chip.

6. The MEMS microphone of claim 1, wherein the acoustic cavity of the silicon-based carrier chip is aligned to the backplate of the monolithic silicon chip.

7. The MEMS microphone of claim 1, wherein the bonding between the monolithic silicon chip and the silicon-based carrier chip is metal eutectic bonding at low temperature below 400° C.

8. The MEMS microphone of claim 1, wherein the conductive cover is either soldered onto the substrate or attached to the substrate by using conductive adhesives.

9. The MEMS microphone of claim 1, wherein the conductive cover is made of either metal or plastic with metal coated or plated.

10. The MEMS microphone of claim 1, wherein the substrate is any printed circuit board with single or multiple FR4 layers and the substrate is formed with electrical lead-outs and pads on both sides.

11. The MEMS microphone of claim 1, wherein the bonding between the silicon based carried chip and the substrate is flip-chip soldering.

12. The MEMS microphone of claim 1, wherein one or more of the electrode pads are bonded onto metal pads on the upper surface of the silicon-based carrier chip.

13. A method for manufacturing a MEMES microphone, comprising:

preparing a monolithic silicon chip integrating an acoustic sensing element and one or more conditioning CMOS integrated circuits, wherein the acoustic sensing element includes a compliant diaphragm, a backplate having through holes, and an air gap between the compliant diaphragm and the backplate, wherein the air gap is located within the monolithic silicon chip;

preparing a silicon-based carrier chip having an acoustic cavity, metal through-silicon via lead-outs, and metal pads on both ends of each of the metal through-silicon via lead-outs;

seal bonding the silicon-based carrier chip with the monolithic chip on the backplate side of the acoustic sensing element using metal eutectic bonding;

flip-chip bonding the assembly of the monolithic chip and the silicon-based carrier chip onto a substrate;

attaching a conductive cover having a center cavity bounded with its edges onto the substrate on its edges, the center cavity accommodates the assembly of the monolithic silicon chip and the silicon-based carrier chip, wherein an acoustic port is formed on either the conductive cover or the substrate for an external acoustic wave to reach the acoustic sensing element, wherein the monolithic silicon chip comprises a plurality of electrode pads on the backplate side of the monolithic silicon chip, the plurality of electrode pads comprise an electrode pad extracted from signal output of the conditioning CMOS integrated circuit and an electrode pad extracted from the power supply to the conditioning CMOS integrated circuit on the same side, wherein the metal eutectic bonding is bonded between the metal pads and the electrode pads so as to bond the silicon-based carrier chip and the monolithic silicon chip.

14. The method of claim 13, wherein the acoustic port is formed on the conductive cover, one or more open holes are formed on the bottom of the acoustic cavity during preparing the silicon-based carrier chip, and the silicon-based carrier chip is seal bonded with the substrate.

15. The method of claim 13, wherein the acoustic port is formed on the substrate, one or more open holes are formed on the bottom of the acoustic cavity during preparing the silicon-based carrier chip, and the silicon-based carrier chip is seal bonded with the substrate.

* * * * *